United States Patent
Dutta et al.

(10) Patent No.: US 10,594,261 B2
(45) Date of Patent: Mar. 17, 2020

(54) PIEZOELECTRIC RESONANCE CONTROLLED TERAHERTZ WAVE MODULATORS

(71) Applicants: Moumita Dutta, San Antonio, TX (US); Ruyan Guo, San Antonio, TX (US); Amar Bhalla, San Antonio, TX (US); Soutik Betal, San Antonio, TX (US)

(72) Inventors: Moumita Dutta, San Antonio, TX (US); Ruyan Guo, San Antonio, TX (US); Amar Bhalla, San Antonio, TX (US); Soutik Betal, San Antonio, TX (US)

(73) Assignee: Board of Regents, The University of Texas Systems, Austin, TX (US)

( * ) Notice: Subject to any disclaimer, the term of this patent is extended or adjusted under 35 U.S.C. 154(b) by 272 days.

(21) Appl. No.: 15/652,656

(22) Filed: Jul. 18, 2017

(65) Prior Publication Data
US 2018/0026581 A1    Jan. 25, 2018

Related U.S. Application Data

(60) Provisional application No. 62/363,916, filed on Jul. 19, 2016.

(51) Int. Cl.
*H03C 3/42* (2006.01)
*H01L 41/083* (2006.01)
(Continued)

(52) U.S. Cl.
CPC ............. *H03C 3/42* (2013.01); *H01L 41/083* (2013.01); *H03C 1/02* (2013.01); *H03C 1/46* (2013.01)

(58) Field of Classification Search
CPC .... H03C 3/42; H03C 1/02; H03C 1/46; H01L 41/083
See application file for complete search history.

(56) References Cited

U.S. PATENT DOCUMENTS

| | | | |
|---|---|---|---|
| 2003/0035610 A1 | 2/2003 | Keys et al. | |
| 2015/0316832 A1* | 11/2015 | Sato | G01J 3/10 250/338.1 |
| 2016/0099701 A1* | 4/2016 | Rinaldi | G01J 5/20 422/90 |

OTHER PUBLICATIONS

Dutta, Moumita, et al. "Low frequency piezoresonance defined dynamic control of terahertz wave propagation." Scientific reports 6 (2016): 38041.
(Continued)

*Primary Examiner* — Jeffrey M Shin
(74) *Attorney, Agent, or Firm* — Thomas | Horstemeyer, LLP

(57) ABSTRACT

Disclosed are various embodiments of a terahertz wave modulator. The wave modulator can include one or more layers of piezoelectric/ferroelectric single crystal or polycrystalline material. The crystalline material can be configured to resonate when a low-energy external excitation is applied. An incident terahertz waveform can be dynamically controlled when the incident terahertz waveform interacts with the at least one layer of piezoelectric crystalline material while the at least one layer of piezoelectric crystalline material is resonating. The dynamic control of the incident terahertz waveform can be with respect to at least one of a phase shift and an amplitude modulation of the waveform.

20 Claims, 8 Drawing Sheets

(51) Int. Cl.
*H03C 1/02* (2006.01)
*H03C 1/46* (2006.01)

(56) References Cited

OTHER PUBLICATIONS

Abo-Bakr, M.; et al (2002) "Steady-State Far-Infrared Coherent Synchrotron Radiation Detected at BESSY II." Physical review letters, 88(25), pp. 254801-1-4.
Byrd, J.M.; et al (2002) "Observation of Broadband Self-Amplified Spontaneous Coherent Terahertz Synchrotron Radiation in a Storage Ring." Physical review letters, 89(22), pp. 224801-1-4.
Chan, W.L.; et al (2007) "Imaging With Terahertz Radiation." Reports on progress in physics, 70(8), pp. 1325-1379.
Carr, G.L.; et al (2002) "High-Power Terahertz Radiation From Relativistic Electrons." Nature, 420(6912), pp. 153-156.
Chen, H.T.; et al (2009) "A metamaterial solid-state terahertz phase modulator." Nature photonics, 3(3), pp. 148-151.
Chen, H.T.; et al (2011) "Manipulation of Terahertz Radiation Using Metamaterials." Laser & Photonics Reviews, 5(4), pp. 513-533.
Dai, J.; et al (2006) "Detection of Broadband Terahertz Waves With a Laser-Induced Plasma in Gases." Physical review letters, 97(10), pp. 103903 1-5.
Driscoll, T.; et al (2008) "Dynamic Tuning of an Infrared Hybrid-Metamaterial Resonance Using Vanadium Dioxide." Applied Physics Letters, 93(2), pp. 024101 1-3.
Doria, A.; et al (2004) "Enhanced Coherent Emission of Terahertz Radiation by Energy-Phase Correlation in a Bunched Electron Beam." Physical review letters, 93(26), pp. 264801 1-4.
Dutta, M.; et al (2015) "Terahertz Electrical and Optical Properties of LiNbO3 Single Crystal Thin Films." In Photonic Fiber and Crystal Devices: Advances in Materials and Innovations in Device Applications IX (vol. 9586, p. 958608). International Society for Optics and Photonics.
Federici, J.; et al (2010) "Review of Terahertz and Subterahertz Wireless Communications." Journal of Applied Physics, 107(11), p. 6.
Fekete, L.; et al (2007) "Ultrafast Opto-Terahertz Photonic Crystal Modulator." Optics letters, 32(6), pp. 680-682.
Ferguson, B.; et al (2002) "Materials for Terahertz Science and Technology." Nature materials, 1(1), p. 26-33.
Hirori, H.; et al (2011) "Single-Cycle Terahertz Pulses With Amplitudes Exceeding 1 MV/cm Generated by Optical Rectification in LiNbO 3." Applied Physics Letters, 98(9), pp. 091106 1-13.
Huang C.; et al (2005) "Real-Time Observation of Pulse Reshaping Using Sr 0.61 Ba 0.39 Nb 2 O 6 Single Crystal Fiber in a Microwave Cavity." Applied Physics Letters, 86(13), pp. 131106 1-3.
Huang, C.; et al (2005) "Measurement of Microwave Electro-Optic Coefficient in Sr 0.61 Ba 0.39 Nb 2 O 6 Crystal Fiber." Applied Physics Letters, 86(21), pp. 211907 1-3.
Hsieh, C.F.; et al (2006) "Voltage-Controlled Liquid-Crystal Terahertz Phase Shifter and Quarter-Wave Plate." Optics letters, 31(8), pp. 1112-1114.
Jiang, J.; et al (2015) "Accelerated Domain Switching Speed in Single-Crystal LiNbO3 Thin Films." Journal of Applied Physics, 117(10), pp. 104101 1-8.

Kampfrath, T.; et al (2011) "Coherent Terahertz Control of Antiferromagnetic Spin Waves." Nature Photonics, 5(1), pp. 31-34.
Kersting, R.; et al (2000) "Terahertz Phase Modulator." Electronics Letters, 36(13), pp. 1156-1158.
Kleine-Ostmann, T.; et al (2004) "Room-Temperature Operation of an Electrically Driven Terahertz Modulator." Applied physics letters, 84(18), pp. 3555-3557.
Kleine-Ostmann, T.; et al (2011) A Review on Terahertz Communications Research. Journal of Infrared, Millimeter, and Terahertz Waves, 32(2), pp. 143-171.
Korbly, S.E.; et al (2005) "Observation of Frequency-Locked Coherent Terahertz Smith-Purcell Radiation." Physical review letters, 94(5), pp. 054803 1-5.
Leahy-Hoppa, M.R.; et al (2007) "Wideband Terahertz Spectroscopy of Explosives." Chemical Physics Letters, 434 (4-6), pp. 227-230.
Leemans, W.P.; et al (2003) "Observation of Terahertz Emission From a Laser-Plasma Accelerated Electron Bunch Crossing a Plasma-Vacuum Boundary." Physical review letters, 91(7), pp. 074802 1-4.
Libon, I.; et al (2000) "An Optically Controllable Terahertz Filter." Applied Physics Letters, 76(20), pp. 2821-2823.
Padilla, W.J.; et al (2006) "Dynamical Electric and Magnetic Metamaterial Response at Terahertz Frequencies." Physical review letters, 96(10), p. 107401 1-4.
Qi, T.; et al (2009) "Collective Coherent Control: Synchronization of Polarization in Ferroelectric PbTiO 3 by Shaped THz Fields." Physical Review Letters, 102(24), p. 247603 1-4.
Rahm, M.; et al (2013) "THz Wave Modulators: a Brief Review on Different Modulation Techniques." Journal of Infrared, Millimeter, and Terahertz Waves, 34(1), pp. 1-27.
Ruchert, C.; et al (2012) Scaling Submillimeter Single-Cycle Transients Toward Megavolts Per Centimeter Field Strength Via Optical Rectification in the Organic Crystal OH1. Optics letters, 37(5), pp. 899-901.
Sensale-Rodriguez, B.; et al (2012) "Broadband Graphene Terahertz Modulators Enabled by Intraband Transitions." Nature communications, 3, p. 780 1-7.
Shi, W.; et al (2002) "Efficient, Tunable, and Coherent 0.18-5.27-THz Source Based on GaSe Crystal." Optics letters, 27(16), pp. 1454-1456.
Stepanov, A.G.; et al (2008) "Generation of 30 μJ Single-Cycle Terahertz Pulses at 100 Hz Repetition Rate by Optical Rectification." Optics letters, 33(21), pp. 2497-2499.
Takahashi, T.; et al (2000) "Observation of Coherent Cerenkov Radiation From a Solid Dielectric with Short Bunches of Electrons." Physical Review E, 62(6), p. 8606-8611.
White, R.T.; et al (2003) "Tunable Single-Frequency Ultraviolet Generation From a Continuous-Wave Ti: Sapphire Laser with an Intracavity PPLN Frequency Doubler." Applied Physics B, 77(6-7), pp. 547-550.
Xu, J.; et al (2002) "Recent Progress in Terahertz Science and Technology." Progress in natural science, 12(10), pp. 729-736.
McIntosh, R.; et al (2011) "Periodically Poled Structure on Microwave Transmissions Evaluated by Scattering Parameters." Integrated Ferroelectrics, 131(1), pp. 219-229.

\* cited by examiner

PIEZOELECTRIC RESONANCE CONTROLLED TERAHERTZ WAVE MODULATORS

CROSS-REFERENCE TO RELATED APPLICATIONS

This application claims the benefit of U.S. Provisional Application No. 62/363,916, filed Jul. 19, 2016, the entire contents of which is hereby incorporated herein by reference.

GOVERNMENT LICENSE RIGHTS

This invention was made with Government support under grant number W911-NF1210082 awarded by the Department of Defense and grant number ECCS-1002380 awarded by the National Science Foundation. The Government has certain rights in the invention.

BACKGROUND

Research in the last few decades has led to many developments related to terahertz (millimeter wave) technologies. The terahertz bandwidth is the frequency range of 100 GHz (0.1 THz) to 30 THz and is situated between the two established frontiers: the microwave and infrared spectral bands. The terahertz bandwidth has not been extensively utilized due to the insufficiency of the associated technology and other scientific constraints. Advancements in femtosecond laser technology, coherent generation, and detection have made the terahertz spectral window accessible to numerous applications and fundamental studies, like imaging, communications, explosive detection, spectroscopy of molecular vibrations, control of spin, and lattice vibrations.

Efficient terahertz devices are required for an active utilization of the terahertz regime. Modulators that can be dynamically tuned are the fundamental components of numerous devices and applications in telecommunication and wave processing systems, such as phased array antennas, isolators, filters, absorbers, frequency shifters, spectral lensing, amplifiers, and lasers. Attempts have been made to develop an efficient design of modulators for terahertz applications, but they are burdened with some inherent drawbacks, such as the need of cryogenic temperature for operation, insufficient speeds of operation, and modulation only up to a few percent.

Most of the approaches reported so far primarily rely on metamaterial resonance to overcome these limitations. Exploitation of natural materials, however, has yet to be effectively studied in this context.

BRIEF DESCRIPTION OF THE DRAWINGS

For a more complete understanding of the embodiments and the advantages thereof, reference is now made to the following description, in conjunction with the accompanying figures briefly described as follows.

Figure 1:
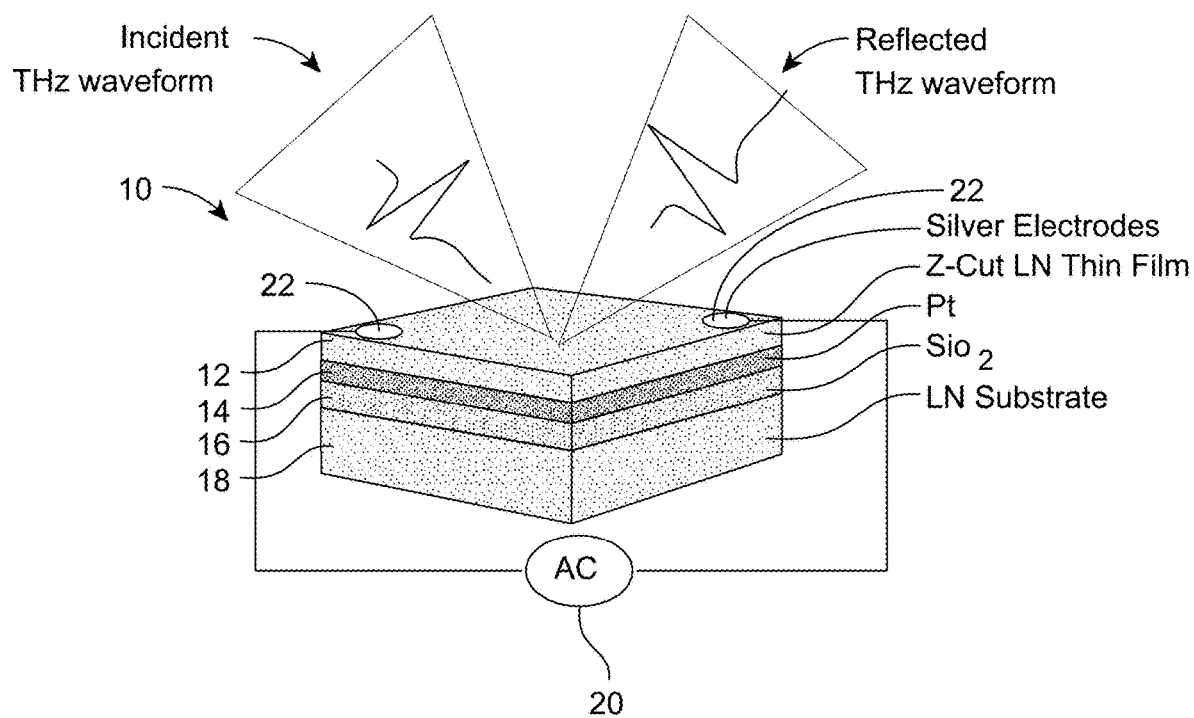
FIG. 1 is a schematic of a terahertz wave modulator according to various embodiments of the present disclosure.

The drawings illustrate only example embodiments and are therefore not to be considered limiting of the scope described herein, as other equally effective embodiments are within the scope and spirit of this disclosure. The elements and features shown in the drawings are not necessarily drawn to scale, emphasis instead being placed upon clearly illustrating the principles of the embodiments. Additionally, certain dimensions may be exaggerated to help visually convey certain principles. In the drawings, similar reference numerals between figures designate like or corresponding, but not necessarily the same, elements.

DETAILED DESCRIPTION

Disclosed herein are terahertz wave modulators that utilize the resonance of natural materials for dynamic control of terahertz (millimeter) waveforms. The wave modulators include a piezoelectric crystalline material, which can be a single crystal material or a poled polycrystalline material. The piezoelectric crystalline material can be activated by applying low-frequency, low-energy excitation, such as a low-frequency, low-energy alternating current (AC) electric field, that causes the material to resonate so as to, in effect, change the dynamic index of refraction of the material. When an incident terahertz waveform interacts with the material during such resonance, a transducer phenomenon occurs in which the waveform is modulated.

In the following disclosure, various specific embodiments are described. It is to be understood that those embodiments are example implementations of the disclosed inventions and that alternative embodiments are possible. All such embodiments are intended to fall within the scope of this disclosure.

A wave modulator is a component that is the core for many applications, such as communications and imaging. Although various modulator designs have been developed, such as quantum well structures, liquid crystals, and metamaterials, exploration of the piezoresonance of natural materials for wave control has yet to be explored. Described herein are wave modulators that utilize such resonance. Also described is experimental demonstration of this phenomenon in which a crystalline anisotropic material is operated at a resonance far away from its equilibrium state using an external excitation field to induce electromagnetic and mechanical lattice wave coupling to govern the wave propagation of an incident terahertz beam so as to tailor its transfer function. This model can facilitate the design and fabrication of highly sensitive and extremely low energy millimeter wave sensors and modulators.

As with the electromagnetic waves, refractive index of a material can be tailored for shaping and modulating its propagation contour. Any engineered profile of polarization control can be used as a driving force for influencing the wave propagation. When piezoelectric materials are operated at resonance, the polarization vectors $\vec{P}$ orient in such a manner that a transition from a valley to a peak in the localized refractive index incorporates a red and blue shift in the dispersion of the interacting wave, which finds expression in the form of phase/amplitude change. The natural materials of the embodiment, piezoelectric crystalline material, is defined to include piezoelectric or ferroelectric single crystals and ferroelectric polycrystalline materials. Although experimental evidence and preliminary understanding can be used to substantiate the perception that such resonant interactions can dramatically impact electromagnetic wave propagation, there is limited analytical explanations describing the sub-millimeter EM wave-matter interactive behavior under such singularity conditions due to the complexity of characterizing and modeling materials at resonance. Provided below is an experimental demonstration of this phenomenon in the terahertz frequency band, in which the phase transfer function is manipulated by the surface wave induced by a device operated at the resonance condition under the influence of a low-frequency low-energy excitation.

Exemplary embodiments are described in detail in the drawings. FIG. 1 illustrates an example embodiment of a phase modulator 10. The phase modulator 10 can be configured to shift the phase of an incident terahertz waveform or pulse. In one embodiment, the phase modulator 10 includes a multilayer thin film structure. As an example, one or more layers of piezoelectric crystalline material can be stacked together, in addition to other layers. Provided on the top of the phase modulator 10 can be one or more piezoelectric crystalline layers 12 of material. This layer 12 can include a piezoelectric crystalline material that can be a single crystal or a poled (oriented) polycrystalline material. In some embodiments, the piezoelectric crystalline layer 12 includes an ion-sliced, z-cut single crystal of lithium niobate ($LiNbO_3$). The piezoelectric material is inclusive of but not limited to a ferroelectric material.

The silicon oxide ($SiO_2$) layer 16 can be coated with a layer 14 of platinum (Pt). The piezoelectric crystalline 12 can be deposited on a platinized silica (e.g. layers 14 and 16). The layer 16 can be grown on a lithium niobate substrate 18. As indicated in FIG. 1, an alternating current (AC) electrical field can be applied to the piezoelectric crystalline layer 12 using an external driving signal source 20 and conductive (silver-Ag) electrodes 22 provided on the surface of the piezoelectric crystalline layer. The electrodes 22 can be positioned at opposite positions (or corners for a rectangular layer 16) of the surface of the piezoelectric crystalline layer 12. By positioning the electrodes 22 at opposite positions, a maximum uninterrupted sample surface can be obtained for the terahertz wave interaction. The signal source 20 can be used to generate a low-frequency, low-energy electric field that causes the piezoelectric crystalline layer 12 to resonate and, therefore, enables the terahertz phase shifting capability of the piezoelectric crystalline layer 12.

Experiments were performed using a phase modulator having a construction similar to that described above and shown in FIG. 1. An ion-sliced, single crystal z-cut lithium niobate thin film having a thickness of 504 nm was deposited on platinized silica grown on a lithium niobate substrate having a thickness of 500 um to form a phase modulator. The lithium niboate thin film was subjected to external field excitation having a frequency ranging from 19.2 kHz to 20.9 kHz and the corresponding phase-responses of the reflected terahertz pulses were studied for induced effect analysis. In order to correlate the changes observed as a function of frequency, the temporal field amplitudes recorded by a terahertz-time domain spectrometer were converted into the frequency domain using Fourier transformation. The material-induced phase response carried by the reflected terahertz wave was then derived from its spectral features for each of the applied field frequencies. The phase response was normalized with respect to the response observed without applying any external field to exclusively capture the field dependent effect.

Figure 2:
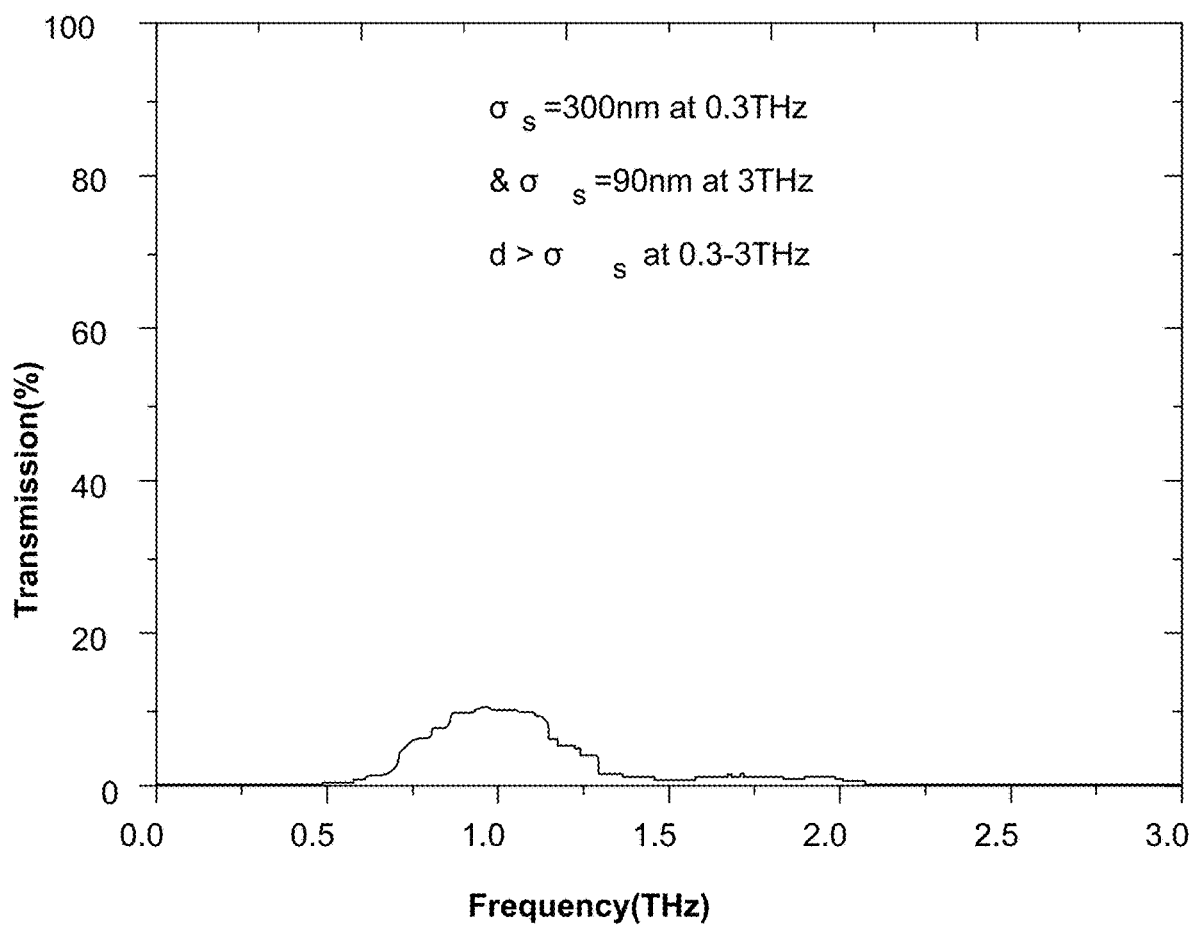
FIG. 2 illustrates THz transmission spectra of a terahertz wave modulator of FIG. 1 according to various embodiments of the present disclosure.

FIG. 2 illustrates THz transmission spectra of a terahertz wave modulator of FIG. 1 according to various embodiments of the present disclosure. The graph shows plots of the terahertz transmission spectra of the phase modulator system. Owing to the impenetrability of the embedded, 400 nm thick, platinum layer (having a skin depth σs of 300 nm at 0.3 THz and 90 nm at 3 THz with terahertz transmission of ~10%), the system can operate in a reflection mode in which the incident energy is mostly reflected back and therefore eliminate the transmission losses.

Figure 3:
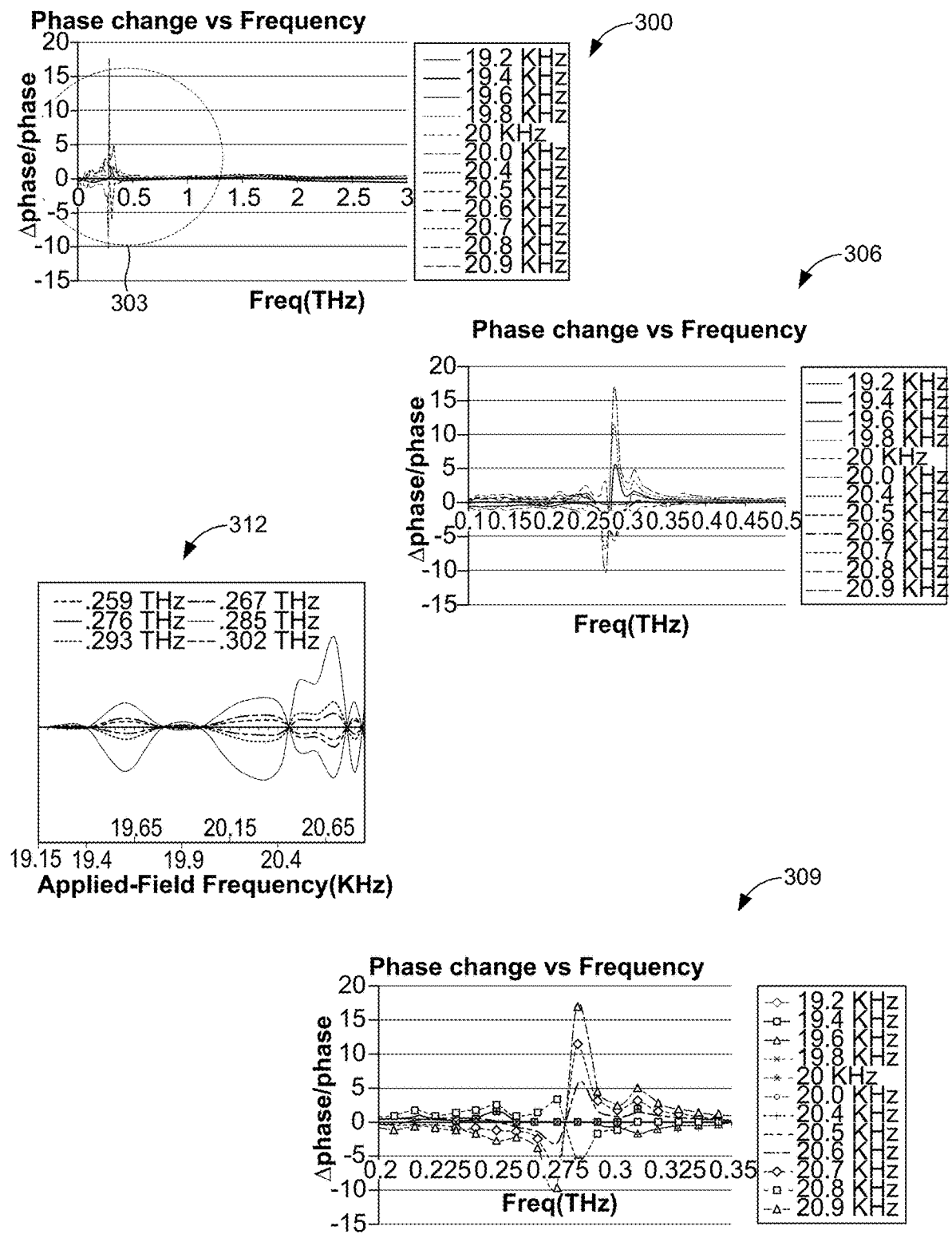
FIG. 3 illustrates a normalized phase response of a reflected Terahertz beam according to various embodiments of the present disclosure.

With reference to FIG. 3, shown in graphs 300, 306, and 309, a normalized phase response is observed in the reflected terahertz beam according to various embodiments of the present disclosure. The graph 306 illustrates a close up of a section 303 of the graph 300. Similarly, the graph 309 illustrates the data from graph 306 with a reduced range of values on the X-axis. The graph 312 illustrates the delta phase divided by the phase across a range of applied-field frequencies.

The material-induced phase response of the reflected terahertz wave derived from its spectral features for each of the applied field frequencies can be plotted for each exciting field. Each response can be normalized with respect to the response observed without applying any external field. As illustrated in FIG. 3, the phase response started prominently from 20.6 kHz with a phase reversal observed at 20.8 kHz. The excitations were observed only in the frequency range of 0.1 to 0.5 THz, after which they flatten out. As shown in graph 312, when plotted against the applied field frequency, the phase response can exhibit a rippling surface wave-like behavior. To further explore this effect, the frequency window, in which a prominent phase response was observed, was further studied by plotting the relative phase shifts at a given terahertz frequency with respect to the frequency of the applied field.

Figure 4:
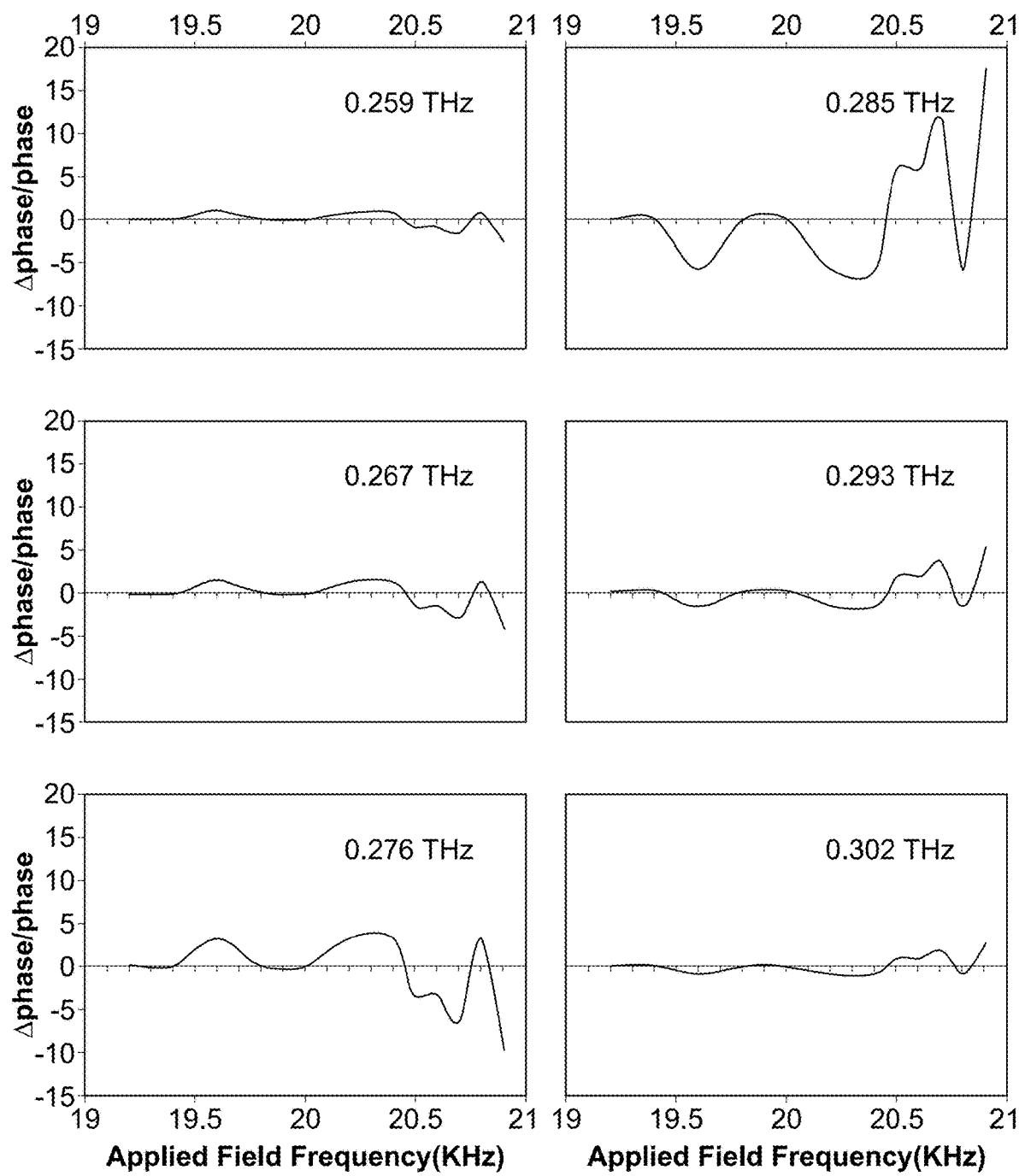
FIG. 4 illustrates piezo-induced phase modulation with respect to the different applied-field frequencies according to various embodiments of the present disclosure.

With reference to FIG. 4, shown are graphs illustrating evidence of resonance-induced phase modulation according to various embodiments of the present disclosure. The resonance-induced phase modulation can be generated by a wave modulator. It can be appreciated that the response starts cropping up from 0.259 THz and continues until 0.276 THz with an eventual increase in relative response. At 0.285 THz, a sudden phase reversal can be observed along with a maximum response, which then dies down and nearly vanishes by 0.302 THz. The piezoresonance frequency of the phase modulator system can be measured to gain insight as to the typical phase response. A vibrometric surface displacement evaluation technique can be employed for quantitative assessment of the system's electromechanical coupling effect. An AC excitation electric field of 10 V peak-to-peak (p-p) varying within the frequency range (19.1 kHz to 20.8 kHz), similar to that used for terahertz phase manipulation as described above, can be applied via two surface electrodes. The respective surface displacement at each operating frequency can be measured. From the surface displacements captured, the maximum deflection was recorded at 20.7 kHz, indicating 20.7 kHz to be its characteristic regime of resonance with the surface displacement profile portraying correspondence to the phase modulation contour observed at 0.285 THz (see FIG. 4).

Figure 5:
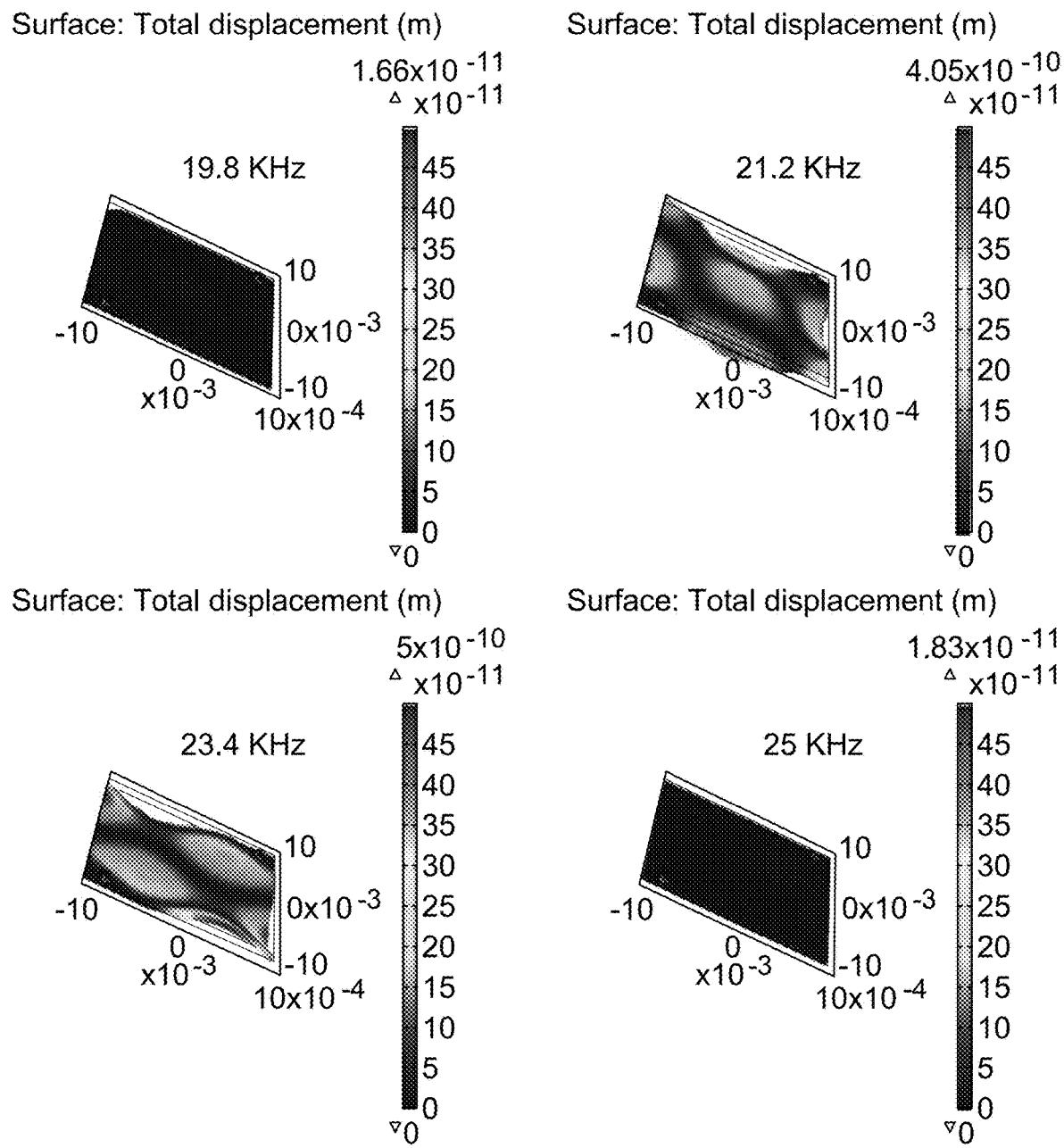
FIG. 5 illustrates finite element analysis (FEA) simulated field induced total surface displacement on a piezoelectric crystalline material of a terahertz wave modulator according to various embodiments of the present disclosure.
Figure 6:
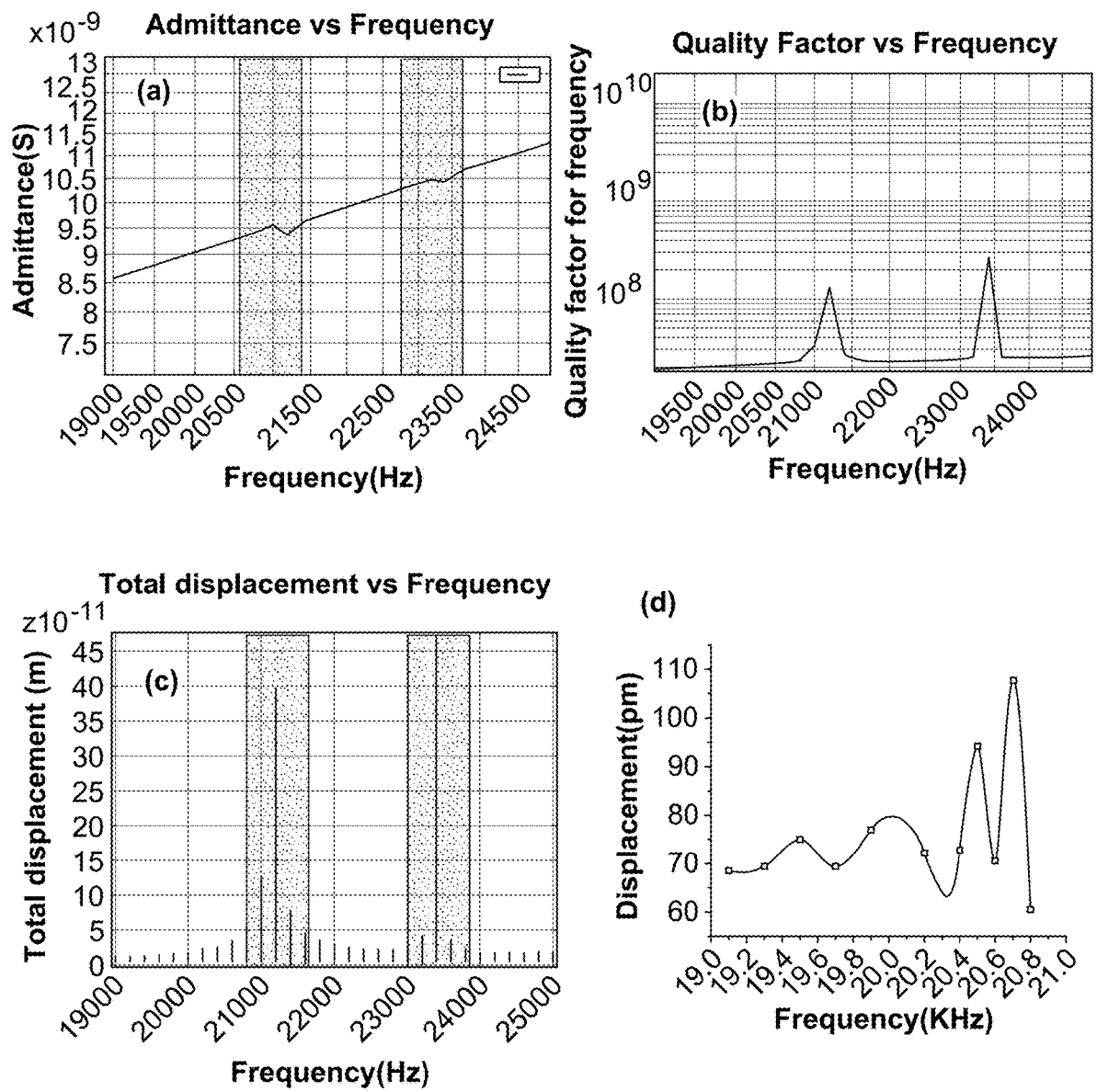
FIG. 6 illustrates a finite element analysis (FEA) simulation scanned over a spectral window showing resonance according to various embodiments of the present disclosure.

With reference to FIGS. 5 and 6, FIG. 5 shows a finite element simulation of the total surface displacement of a field-induced ferroelectric crystalline material of a terahertz wave modulator according to various embodiments, and FIG. 6 shows a finite element simulation scanned over a spectral window showing resonance according to various embodiments. Additional finite element analysis simulation can be performed by reproducing similar experimental conditions. The simulation can corroborate the experimental outcomes. The results of a simulations are shown in FIG. 6, which shows (a) admittance, (b) total displacement, and (c) quality factor plots, with the other frequencies hardly showing any interaction. FIG. 6(d) shows a vibrometer surface displacement profile. When scanned over a spectral window of 19 kHz to 25 kHz, the simulated data acquired can indicate two resonating frequencies with a primary resonance occurring at 21.2 kHz and a secondary resonance at 23.4 kHz (see FIGS. 6(a)-6(c)). The simulated primary mode of resonance thus lies approximately within 2% of what has been observed experimentally (20.8 kHz, where the terahertz phase response showed a phase reversal as depicted in FIG. 3), providing concrete support towards its scientific origin.

These results show that the phase modulator system, when operated near its resonance frequency (20.8 kHz) (and far away from its equilibrium state), produced charge-coupled strain that modulated the wave propagation of the incident terahertz pulses in the form of phase delay. Therefore, a "transducer effect" has qualitatively demonstrated in which a low-frequency, low-energy electric field can be used as the control to govern the interactions of waves, i.e., electromagnetic and mechanical lattice vibrations at resonance in an anisotropic and strongly phonon-polariton coupled material.

When operated at the resonance condition, at minimum impedance frequency, the system approximates a series resonance frequency at which impedance of the equivalent electrical circuit describing the element is approximated as zero, if the resistance caused by mechanical losses is ignored. With a further increase in frequency, the impedance increases to a maximum value (i.e., minimum admittance). The maximum impedance frequency, which can also be referred to as an anti-resonance frequency, approximates a parallel resonance frequency, i.e., the frequency at which parallel impedance in the equivalent electrical circuit is considered to be infinitely large, ignoring the resistance incorporated by the associated mechanical losses. The maximum response from the element is considered to be at a point between these resonant and the antiresonant nodes. For an optical material, the impedance can correspond to the effective index of refraction.

Figure 7:
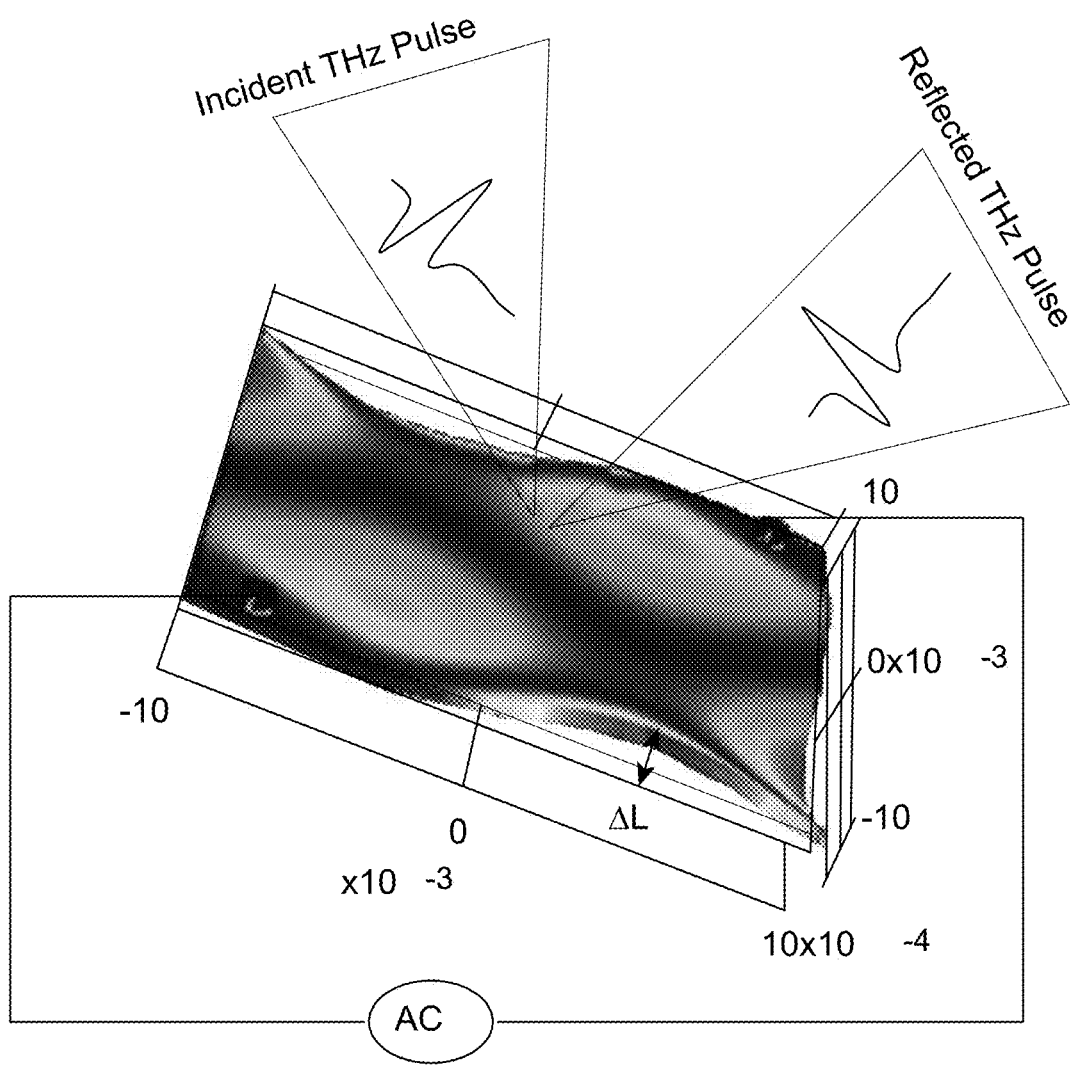
FIG. 7 illustrates a field controlled resonance-induced phase modulation of an incident THz beam according to various embodiments of the present disclosure.

Shown in FIG. 7 is a diagram illustrating the interplay between electromagnetic and mechanical lattice vibrations at resonance in an anisotropic and strongly phonon-polariton coupled material according to various embodiments. Charge-coupled strain ($\Delta L$) induced by the applied external field can modulate the wave propagation (phase delay) of the incident terahertz pulses.

The phonon vibrations developed from piezoelectric effect can be translated into surface waves. The surface waves can create the resonant and antiresonant nodes, and the resonant and antiresonant nodes can introduce the induced changes in the phase of the reflected wave (as illustrated in FIG. 7). Let the incident terahertz wave $\psi_{inci}(\vec{z},t)$ having angular frequency of $\omega_{THz}$ propagating along the z direction with a wave vector of $\vec{k}$ be represented as:

$$(\vec{z},t) \rightarrow \psi_0(\vec{z},t)\exp[i(\vec{k}\cdot\vec{z}-\omega_{THz}\cdot t)] \quad (1)$$

Thus the reflected wave $\psi_{reflec}(\vec{z},t)$ will have an added phase shift $\Delta\varphi$ introduced as:

$$\psi\text{reflec}(\vec{z},t) \propto \psi_0(\vec{z},t)\exp[i(\vec{k}\cdot\vec{z}-\omega_{THz}\cdot t)+\Delta\varphi]. \quad (2)$$

This phase shift can be attributed to the path length difference ($\Delta L$) observed by the reflected beam induced by the piezoelectric effect, shown as:

$$\Delta\varphi = \frac{2\pi}{\lambda}(2\Delta L), \quad (3)$$

where $\lambda$ is the wavelength of the incident wave.

Now, from converse piezo effect, the charge-coupled strain $x_{jk}$ can be related to the excitation field $E_i$, where $d_{ijk}$, is the piezoelectric coefficient of the material, shown as:

$$x_{jk} = d_{ijk}E_i, \quad (4)$$

where, $$x_{jk} = \frac{\Delta L}{L}$$

or, $$\Delta L = L \cdot d_{ij}.$$

The applied AC field with excitation frequency of $$\frac{\omega_{ex}}{2\pi}$$

can be represented as:

$$E_i = E_0(\omega_{ex}\cdot t). \quad (5)$$

Therefore, using equation (5), equation (4) becomes:

$$\Delta L = L \cdot d_{ijk} \cdot E_0(\omega_{ex}\cdot t) \quad (6)$$

Using equation (3), $$\Delta\varphi = \frac{2\pi}{\lambda}[2L\cdot d_{ijk}\cdot E_0\text{Sin}(\omega_{ex}\cdot t)], \quad (7)$$
$$= \frac{4\pi L d_{ijk}}{\lambda}E_0(\omega_{ex}\cdot t)\bigg].$$

Therefore, from equation (2), the reflected wave becomes:

$$\psi_{refle}(\vec{z},t) \propto \psi_0(\vec{z},t)\exp\bigg[i(\vec{k}\cdot\vec{z}-\omega_{THz}\cdot t)+\frac{4\pi L d_{ijk}}{\lambda}E_0\text{Sin}(\omega_{ex}\cdot t)\bigg]. \quad (8)$$

This design can govern the control over electromagnetic waves and the field distribution of the electromagnetic waves with interacting condensed matter operated at non-equilibrium resonance states; and the design can facilitate the exchanges with the charge-coupled density gradient within these states. Thus, a device design with a precise topological arrangement of the polarization direction $\vec{P}$, of arrays of crystalline modules at resonance can govern directional propagation of electromagnetic wave, which can be further extended to achieve a profile-of-polarization-engineered, guided propagation for terahertz waves.

Therefore, the matter-wave interrelations leading to phase modulation of the incident wave influenced by crystalline materials' resonance in the frequency range of 200 GHz to 3 THz can be demonstrated and corroborated both by experimental and simulation data. The results can be extrapolated to a periodic arrangement of arrays of polarization vector $\vec{P}$, which can weave the required waveguide condition leading towards the topologically guided propagation of millimeter waves, which subsequently may pave the way towards non-reciprocal millimeter wave propagations by realizing dynamically defined modulator structures.

The multilayered phase modulator system can include an ion-sliced, single crystal z-cut $LiNbO_3$ thin film of 504 nm deposited on platinized silica grown on a lithium niobate substrate of 500 μm. In one embodiment, the Mini-Z THz-TDS spectrometer by Zomega can be used to perform an initial terahertz characterization. Based on the terahertz signatures correlated to different polar regions observed both for electroded and non-electroded thin film systems, the configuration described above can be suited for the requirements of a modulator design. Owing to the impenetrability of the embedded, 400 nm thick platinum layer having a skin depth σs of 300 nm at 0.3 THz and 90 nm at 3 THz exhibiting terahertz transmission ~10% (as shown in FIG. 2), the modulator can operate in a reflection mode in which most of the incident energy is reflected back.

The top layer can be excited by applying external field via two conductive (such as silver-Ag) electrodes at two opposite positions (or corners) of the surface to excite the thin film. The electrodes can be positioned such that the sample aperture for the terahertz interaction is maximized. The relative changes thus induced by the excitation field can be probed using the terahertz time domain reflection spectroscopy.

A vibrometer can also be used. In some embodiments, the piezoresonant frequency measurements can be conducted using an UHF-120 Polytec Vibrometer (Irvine, Calif.). This vibrometer can operate on the laser Doppler effect and can be based on an interferometry technique in which non-contact vibration measurements are performed on the sample surface. An AC electric field of 10 V p-p can be applied at various frequencies across the surface of the sample, such as, for example, via two silver electrodes situated at two opposite corners. In one embodiment, the waveform can be applied using an Agilent 33220a waveform generator.

The laser beam from the laser Doppler vibrometer (LDV) can be directed to the surface of the sample and the vibrational amplitude, and frequencies can be evaluated from the Doppler shift of the reflected laser beam with respect to the internal reference. The frequency shift thus measured can be introduced due to the displacement of the sample surface. The LDV can count the bright-dark fringes on the detector and directly measure the displacement and the vibrational velocity. Using suitable interpolation techniques, LDV can attain a resolution of 2 nm, and with digital demodulation, the resolution can further reach down to the pm range. In some embodiments, the LDV can be conjugated with a WavePro 725Zi Lecroy Oscilloscope (Chestnut Ridge, N.Y.) and a SMBV100A Rohde & Schwarz-Vector Signal Generator (Munchen, Germany) to cover a broad frequency range up to 6 GHz.

Figure 8:
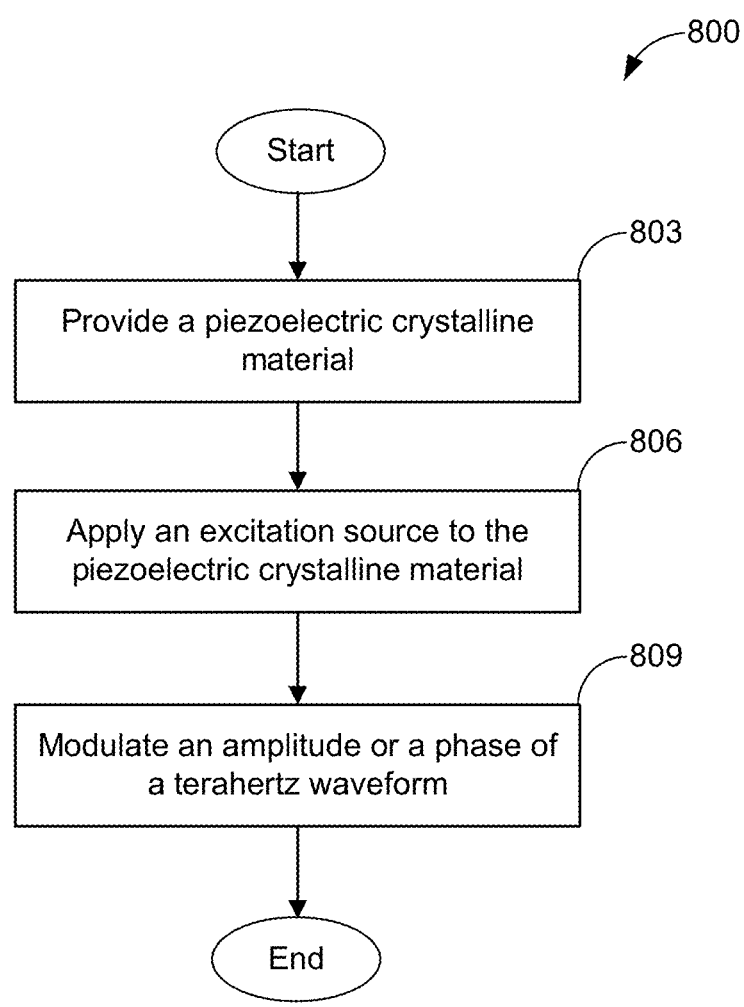
FIG. 8 illustrates an example flowchart that provides an example of modulating with respect to a terahertz waveform according to various embodiments of the present disclosure.

Before turning to the process flow diagrams of FIG. 8, it is noted that embodiments described herein may be practiced using an alternative order of the steps illustrated in FIG. 8. That is, the process flow illustrated in FIG. 8 is provided as an example only, and the embodiments may be practiced using process flows that differ from those illustrated. Additionally, it is noted that not all steps are required in every embodiment. In other words, one or more of the steps may be omitted or replaced, without departing from the spirit and scope of the embodiments. Further, steps may be performed in different orders, in parallel with one another, or omitted entirely, and/or certain additional steps may be performed without departing from the scope and spirit of the embodiments.

Turning to FIG. 8, shown is a flowchart 800 that provides one example of modulating with respect to a terahertz waveform according to various embodiments. At box 803, a piezoelectric crystalline material can be provided. For example, the piezoelectric crystalline material can be deposited on a substrate. The substrate can include a platinum layer or other material. According to one embodiment, the piezoelectric crystalline material is a z-cut LN thin film layer, such as layer 12 in FIG. 1. In some embodiments, multiple layers of piezoelectric crystalline material are stacked. For example, multiple layers of the piezoelectric crystalline material can occupy substantially parallel planes with respect to each other. In some embodiments, the piezoelectric crystalline material can be made from a single crystalline material. In some embodiments, the piezoelectric crystalline material can be poled polycrystalline material.

At box 806, an excitation source is applied to the piezoelectric crystalline material. The electrodes 22 (FIG. 1) can be coupled to the layer 12. The excitation source 20 (FIG. 1) can couple to the layer 12 via the electrodes 22. The excitation source 20 can apply an AC signal to the electrodes 22. The AC signal can be a low-frequency, low-energy AC electric field At box 809, amplitude or phase of a terahertz waveform can be modulated. The waveform can be modulated via the piezoelectric crystalline material. The terahertz waveform can be delivered to interact with the piezoelectric crystalline material.

A phrase, such as "at least one of X, Y, or Z," unless specifically stated otherwise, is to be understood with the context as used in general to present that an item, term, etc., can be either X, Y, or Z, or any combination thereof (e.g., X, Y, and/or Z). Similarly, "at least one of X, Y, and Z," unless specifically stated otherwise, is to be understood to present that an item, term, etc., can be either X, Y, and Z, or any combination thereof (e.g., X, Y, and/or Z). Thus, as used herein, such phrases are not generally intended to, and should not, imply that certain embodiments require at least one of either X, Y, or Z to be present, but not, for example, one X and one Y. Further, such phrases should not imply that certain embodiments require each of at least one of X, at least one of Y, and at least one of Z to be present.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

Therefore, at least the following is claimed:

1. A terahertz wave modulator comprising:
   at least one layer of piezoelectric crystalline material configured to resonate when a low-energy external excitation is applied, wherein the terahertz wave modulator is configured to operate in a transmission/reflection mode-selective condition; and
   wherein an incident terahertz waveform is dynamically controlled, as indicated by its phase shift or amplitude modulation, when the incident terahertz waveform interacts with the at least one layer of piezoelectric crystalline material while the at least one layer of piezoelectric crystalline material is resonating.

2. The wave modulator of claim 1, wherein the piezoelectric crystalline layer comprises a single crystal material.

3. The wave modulator of claim 1, wherein the piezoelectric crystalline layer comprises a poled polycrystalline material.

4. The terahertz wave modulator of claim 1, wherein an operational temperature range of the terahertz wave modulator is based at least in part on a ferroelectric material for the at least one layer of piezoelectric crystalline material.

5. The terahertz wave modulator of claim 1, wherein the at least one layer of piezoelectric crystalline material comprises a stack of layers (multilayer) of piezoelectric crystalline material.

6. The terahertz wave modulator of claim 5, wherein an operational frequency window of the terahertz wave modulator is based at least in part on a sequencing of the stack of layers of piezoelectric crystalline material.

7. The terahertz wave modulator of claim 5, wherein an operational frequency window of the terahertz wave modulator is based at least in part on physical dimensions of the layers of piezoelectric crystalline material.

8. The terahertz wave modulator of claim 7 wherein the operational frequency window of the terahertz wave modulator is further based at least in part on a respective direction of polarization for each layer in the stack of layers of piezoelectric crystalline material.

9. The terahertz wave modulator of claim 1, wherein a choice of at least one layer of piezoelectric crystalline material is based at least in part on a respective THz response for each of the at least one layer of piezoelectric crystalline material to reduce unwanted energy loss.

10. The terahertz wave modulator of claim 1, wherein the at least one layer of piezoelectric crystalline material comprises z-cut lithium niobate fabricated using crystal ionic slicing and wafer bonding.

11. The terahertz wave modulator of claim 1, further comprising a substrate and a wafer bonded silicon oxide layer formed on the substrate.

12. The terahertz wave modulator of claim 11, further comprising a platinum layer formed on the wafer bonded silicon oxide layer, wherein the at least one layer of piezoelectric crystalline material is formed on the platinum layer to facilitate a predetermined amount of an operational window for an incident wave based at least in part on whether a mode of operation is transmission or reflection.

13. The terahertz wave modulator of claim 1, further comprising a voltage source that applies an alternating current (AC) excitation electric field to at least one layer of piezoelectric crystalline material.

14. The terahertz wave modulator of claim 13, further comprising electrodes formed on the surface or across the thickness of the at least one layer of piezoelectric crystalline material to which the AC excitation electric field is applied.

15. A method for modulating a terahertz waveform, the method comprising:
   providing at least one layer of piezoelectric crystalline material comprising a poled polycrystalline material;
   applying an external excitation to the at least one layer of piezoelectric crystalline material; and
   modulating an amplitude and a phase of a terahertz waveform via the at least one layer of piezoelectric crystalline material.

16. The method of claim 15, further comprising delivering the terahertz waveform to interact with the at least one layer of piezoelectric crystalline material.

17. The method of claim 15, wherein the at least one layer of piezoelectric crystalline material comprises a single crystal material.

18. The method of claim 15, wherein applying the external excitation comprises applying a low-frequency, low-energy alternating current (AC) electric field to the at least one layer of piezoelectric crystalline material.

19. A method for modulating a terahertz waveform using a terahertz wave modulator, the method comprising:
   providing at least one layer of piezoelectric crystalline material;
   applying an external excitation to the at least one layer of piezoelectric crystalline material; and
   modulating an amplitude and a phase of a terahertz waveform via the at least one layer of piezoelectric crystalline material, wherein the terahertz wave modulator is configured to operate in a transmission/reflection mode-selective condition.

20. The method of claim 19, wherein the at least one layer of piezoelectric crystalline material comprises a single crystal piezoelectric material or a poled polycrystalline material.

* * * * *